United States Patent
Zhou

(10) Patent No.: US 11,295,922 B2
(45) Date of Patent: Apr. 5, 2022

(54) DEVICES AND METHODS FOR PROGRAMMING A FUSE

(71) Applicant: SKYWORKS SOLUTIONS, INC., Irvine, CA (US)

(72) Inventor: Bo Zhou, Acton, MA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 17/099,710

(22) Filed: Nov. 16, 2020

(65) Prior Publication Data

US 2021/0175038 A1 Jun. 10, 2021

Related U.S. Application Data

(63) Continuation of application No. 16/035,701, filed on Jul. 15, 2018, now Pat. No. 10,840,049.

(60) Provisional application No. 62/533,881, filed on Jul. 18, 2017.

(51) Int. Cl.
| | | |
|---|---|---|
| H01H 85/46 | (2006.01) | |
| H01H 85/02 | (2006.01) | |
| H01H 85/143 | (2006.01) | |
| H04B 1/3827 | (2015.01) | |
| H01L 23/62 | (2006.01) | |
| H01H 85/00 | (2006.01) | |
| H01L 23/66 | (2006.01) | |
| H04B 1/16 | (2006.01) | |

(52) U.S. Cl.
CPC ........ *H01H 85/46* (2013.01); *H01H 85/0095* (2013.01); *H01H 85/0241* (2013.01); *H01H 85/143* (2013.01); *H01L 23/62* (2013.01); *H01L 23/66* (2013.01); *H04B 1/1607* (2013.01); *H04B 1/3833* (2013.01); *H01H 2085/0283* (2013.01); *H01L 2223/6677* (2013.01)

(58) Field of Classification Search
CPC ..................................................... H01H 85/46
USPC ..................................................... 365/225.7
See application file for complete search history.

(56) References Cited

U.S. PATENT DOCUMENTS

| | | | | |
|---|---|---|---|---|
| 6,956,784 B1 * | 10/2005 | Laing | ..................... | G11C 17/16 365/154 |
| 7,710,813 B1 * | 5/2010 | Im | ......................... | G11C 17/18 365/225.7 |
| 2005/0247996 A1 * | 11/2005 | Chung | ................... | H01G 4/255 257/529 |
| 2005/0247997 A1 * | 11/2005 | Chung | ................... | G11C 17/18 257/530 |
| 2011/0012668 A1 * | 1/2011 | Rosik | ..................... | G11C 17/18 327/525 |
| 2015/0023088 A1 * | 1/2015 | Sforzin | ................... | G11C 17/16 365/96 |
| 2017/0346242 A1 * | 11/2017 | Howlett | ................. | H02H 3/202 |

* cited by examiner

*Primary Examiner* — Muna A Techane
(74) *Attorney, Agent, or Firm* — Chang & Hale LLP

(57) ABSTRACT

Fuse programming circuits, devices and methods. In some embodiments, a fuse circuit can include a fuse pad configured to receive a voltage, a fuse having a first end coupled to the fuse pad and a second end coupled to a switching element configured to enable a current to pass from the fuse pad to a ground potential.

20 Claims, 4 Drawing Sheets

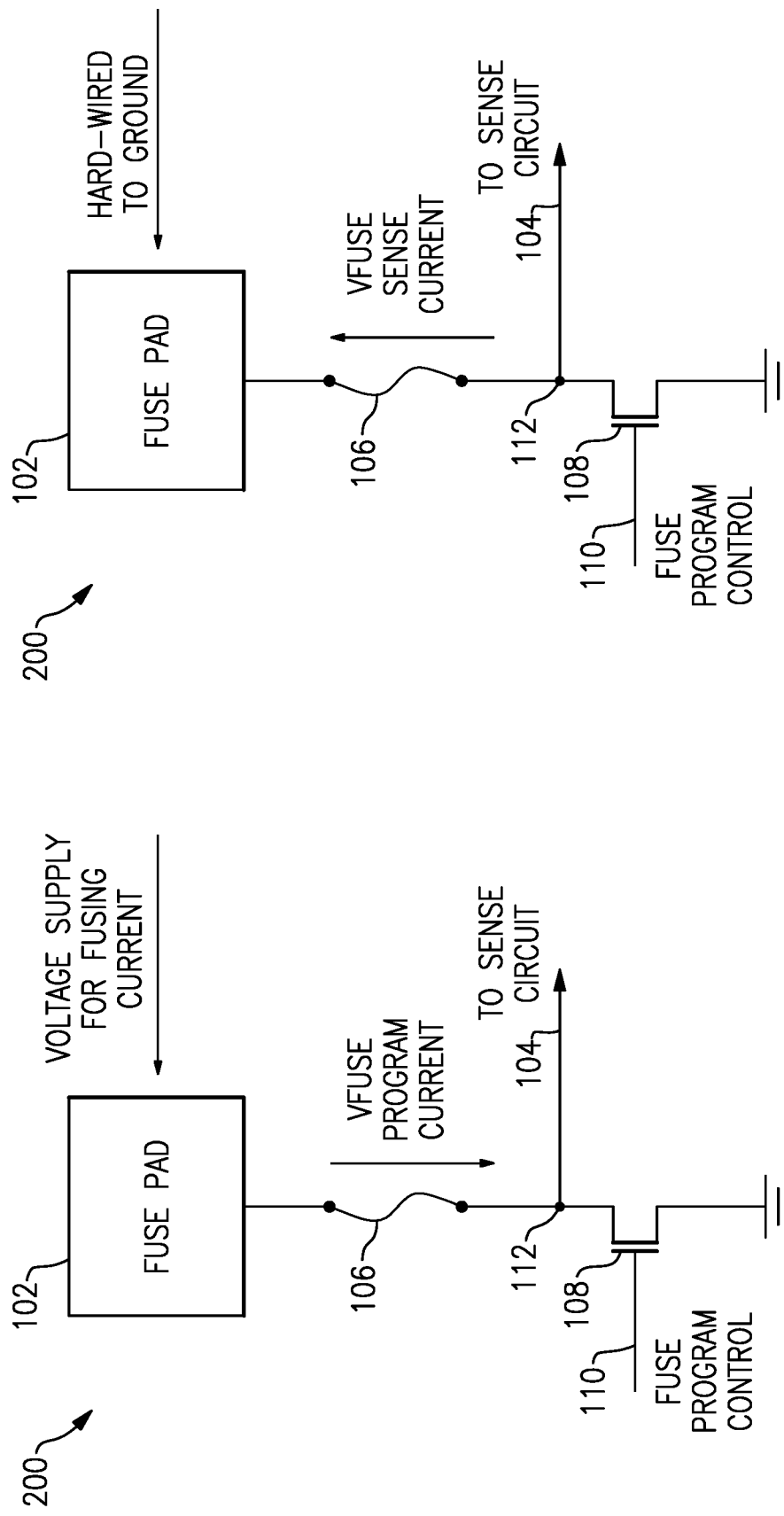

DEVICES AND METHODS FOR PROGRAMMING A FUSE

CROSS-REFERENCE TO RELATED APPLICATION(S)

This application is a continuation of U.S. patent application Ser. No. 16/035,701, filed Jul. 15, 2018, entitled "CIRCUITS, DEVICES AND METHODS FOR PROGRAMMING A FUSE," which claims priority to U.S. Provisional Application No. 62/533,881, filed Jul. 18, 2017, entitled "PSEUDO FUSE PAD," the disclosure of each of which is hereby expressly incorporated by reference herein in its respective entirety.

BACKGROUND

Field

The present disclosure relates to fuse state programming and sensing technology implemented in semiconductor devices.

Description of the Related Art

In many integrated circuits implemented on semiconductor devices such as die, fuses can be utilized to store information. For example, fuse-stored values can provide information about part-to-part and/or process variations among different integrated circuit die. With such information, a given integrated circuit die can be operated appropriately to provide desired functionality.

SUMMARY

In accordance with some implementations, the present disclosure relates to a fuse circuit that includes a fuse pad configured to receive a voltage, a fuse having a first end and a second end, the first end coupled to the fuse pad and a switching element coupled to the second end of the fuse and configured to enable a current to pass from the fuse pad to a ground potential.

In some embodiments, the fuse circuit further comprises a fuse state sensing circuit coupled to the second end of the fuse. In some embodiments, the fuse state sensing circuit is configured to be coupled to a plurality of fuse circuits. In some embodiments, the fuse state sensing circuit is dedicated to only be coupled to the fuse circuit.

In some embodiments, the switching element is a voltage-controlled switching element. In some embodiments, the voltage-controlled switching element is coupled to a fuse program control signal.

In some embodiments, the switching element is configured to be closed during a programming operational mode of the fuse. In some embodiments, the fuse pad receives a programming voltage during a programming operational mode of the fuse.

In some embodiments, the switching element is configured to be open during a sensing operational mode of the fuse. In some embodiments, the fuse pad is coupled to a ground potential during a sensing operational mode of the fuse.

In some embodiments, the fuse circuit is implemented on a semiconductor die. In some embodiments, the switching element is metal oxide field effect transistor.

According to some teachings, the present disclosure relates to a method for programming a state of a fuse element. The method includes providing a fuse pad coupled to a first end of a fuse, a switching element coupled to a second end of the fuse, and a fuse state sensing circuit coupled to the second end. The method may further include closing the switching element, applying a voltage at the fuse pad so that a programming current flows through the fuse, opening the switching element and coupling the fuse pad to a ground potential.

In some embodiments, closing the switching element comprises applying a fuse program control signal to the switching element. In some embodiments, opening the switching element comprises ceasing to apply a fuse program control signal to the switching element. The method may further include, applying a sense current to the second end of the fuse from the fuse state sensing circuit. In some embodiments the method includes sensing a state of the fuse based on a voltage drop detected and measured by the fuse state sensing circuit across the fuse.

In some implementations, the present disclosure relates to a wireless device that includes an antenna configured to at least receive a radio-frequency signal, and a receive module configured receive and process the radio-frequency signal. The receive module has a semiconductor die that includes an integrated circuit. The receive module further includes a fuse circuit including a fuse pad configured to receive a voltage, a fuse having a first end coupled to the fuse pad and a second end coupled to a switching element configured to enable a current to pass from the fuse pad to a ground potential and a fuse state sensing circuit.

In some embodiments, the antenna is a diversity antenna. In some embodiments, the wireless device is a cellular device.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

FIG. 2A shows a fuse system that includes a fuse pad having one or more features as described herein.

FIG. 2B shows a fuse system that includes a fuse pad having one or more features as described herein.

DETAILED DESCRIPTION OF SOME EMBODIMENTS

The headings provided herein, if any, are for convenience only and do not necessarily affect the scope or meaning of the claimed invention.

In many integrated circuit devices, fuses are widely utilized to store values to provide useful information. For example, fuse-stored values can provide information about part-to-part and/or process variations among different devices such as integrated circuit die. With such information, a given integrated circuit die can be operated appropriately to provide improved or desired performance. In another example, fuse-stored values can be utilized as unique codes to provide, for example, security functionality.

In some embodiments, an integrated circuit implementing a fuse pad to program a fuse has limited space for pads or contacts dedicated to such a limited functionality. Additionally, this would limit the available space for an additional pad for sensing the state of a respective fuse. Existing programmable fuses may require two pads or contacts for a respective fuse circuit, to program the fuse and to sense it, respectively. An integrated circuit die can include multiple fuses (e.g., greater than 50). Thus, it is desirable to have a fuse programming and sensing circuit be relatively compact to allow the corresponding die to also be more compact. It is also desirable to have a fuse programming and sensing circuit have smaller transient current consumption to allow the corresponding die to be more power efficient.

Figure 1B:
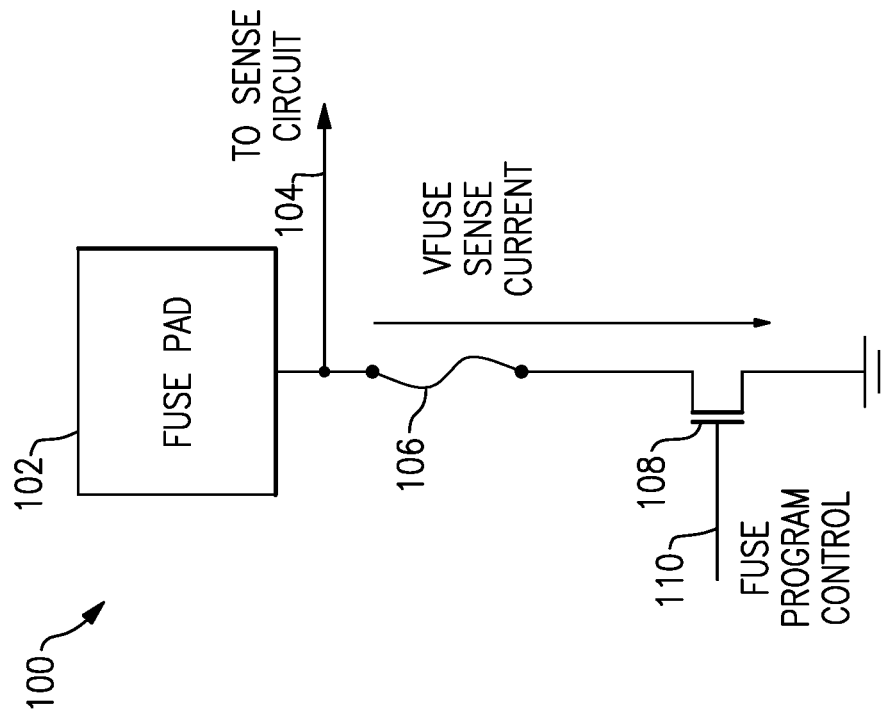
FIG. 1B shows a fuse system that includes a fuse pad, in accordance with some implementations.
Figure 1A:
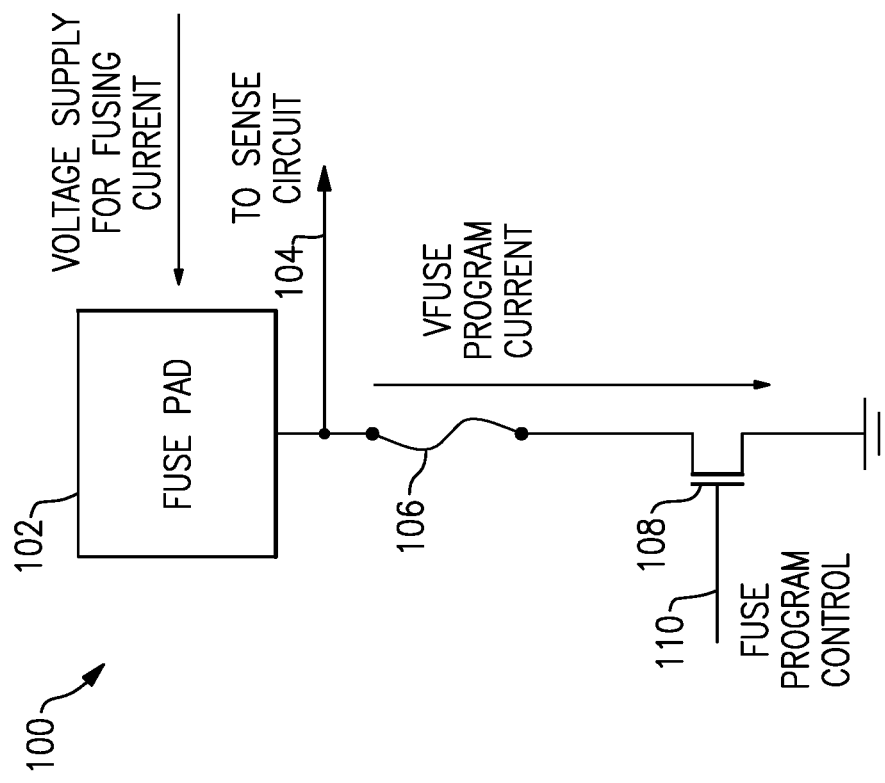
FIG. 1A shows a fuse system that includes a fuse pad, in accordance with some implementations.

FIG. 1A shows a fuse system 100 (or fuse circuit) that includes a fuse pad 102, in accordance with some implementations. The fuse system 100 shown in FIG. 1A includes a fuse pad 102 configured to receive a voltage (e.g., a programming voltage) and/or a fusing supply current to pass through a fuse 106. Fuse 106 may have a first end coupled to fuse pad 102, and a second end coupled to switching element 108. In some embodiments, switching element 108 is a transistor, and in some embodiments, it is a metal oxide semiconductor field effect transistor (MOSFET). Switching element 108 may be controlled or operable by a fuse program control signal 110. For example, if switching element 108 is a voltage controlled switching element such as a MOSFET, as shown, fuse program control signal 110 may be a voltage applied to the gate of switching element 108 to close the switch. In some embodiments, to open switching element 108 (e.g., from a closed state), fuse program control signal 110 ceases to be applied.

FIG. 1A illustrates a conventional approach to programming a fuse 106, using an application of a fusing current or voltage applied to fuse pad 102, while a switching element 108 is closed (e.g., a fuse program control signal/voltage is applied to switching element 108). In some embodiments switching element 108 is substantially simultaneously closed while the fusing current and/or voltage is applied to fuse pad 102. As can be seen in FIG. 1A, when switching element 108 is closed, a programming current (e.g., shown as having a voltage $V_{FUSE}$ across the fuse), has a path to ground, and can therefore alter a physical state of the fuse. This alteration of a physical state of the fuse may be referred to as programming or "blowing" the fuse. During this programming operational mode of the fuse, a sense circuit coupled to sense signal line 104 (e.g., coupled to the first end of fuse 106) may be used to determine if the fuse has been successfully programmed or not. In the example of FIG. 1A, in some embodiments, a dedicated pad would be required to provide a source for the fuse program control signal/voltage 110 used to control operation of the switching element 108.

FIG. 1B shows a fuse system 100 that includes a fuse pad 102, in accordance with some implementations. In FIG. 1B, fuse pad 102 is no longer having a fusing current and/or voltage applied to it, for purposes of programming or blowing fuse 106. FIG. 1B illustrates a sensing operational mode of the fuse, where the voltage drop across fuse 106 is being determined by a sensing circuit on signal line 104. In this conventional approach, the sensing circuit signal line 104 is coupled to the first end (e.g., the end coupled to fuse pad 102), of fuse 106. In order to sense the state of fuse 106 (e.g., blown or intact), the sensing circuit needs to pass a sensing current through fuse 106. In order to do this, a voltage must be applied (e.g., fuse program control signal/ voltage 110) to switching element 108 to close it, and allow the sensing current to flow through fuse 106 to ground. In order for switching element 108 to be closed by application of a voltage, fuse program control signal line 110 must be coupled to another pad, distinct from fuse pad 102. This adds to the complexity and area requirements of an integrated circuit implementing fuse circuit 100.

FIG. 2A shows another fuse system 200 (or fuse circuit) that includes a fuse pad 102, having one or more features as described herein. Unlike in fuse system 100 of FIGS. 1A and 1B, sensing circuit signal line 104 is coupled to the second end of fuse 106. FIG. 2A illustrates a reference node 112 where the second end of fuse 106, sensing circuit signal line 104 and a drain terminal of switching element 108 (e.g., depicted as a three-terminal device) are all coupled.

Similar to fuse system 100, programming fuse 106 includes applying a fusing current and/or voltage to fuse pad 102, and closing switching element 108 in order to allow a programming current to pass through fuse 106 to the ground potential coupled to a source terminal of switching element 108.

FIG. 2B shows a fuse system 200 that includes a fuse pad 102 having one or more features as described herein. In FIG. 2B, rather than remaining unused and floating, fuse pad 102 is hard-wired, or coupled to a ground potential. As a result, in order for a sensing circuit coupled to reference node 112 (e.g., the second end of fuse 106) to read a voltage across fuse 106, a sensing current can be generated by the sensing circuit, passed over signal line 104 and through fuse 106 to the grounded fuse pad 102.

This arrangement shown in FIG. 2B does not require activation of switching element 108 during a sensing operational mode of the fuse circuit. As a result, both fuse pad 102 and switching element 108 require application of a voltage during a programming operational mode of fuse 106, and neither fuse pad 102 nor switching element 108 require application of a voltage during a sensing operational mode of fuse 106. As such, a source of the fuse program control signal 110 may be derived from fuse pad 102, eliminating the need for an additional pad to supply voltage for fuse program control line 110 coupled to switching element 108.

In some implementations, a method is provided for programming a state of a fuse element. The method may include providing a fuse pad coupled to a first end of a fuse, a switching element coupled to a second end of the fuse, and a fuse state sensing circuit coupled to the second end. For example, as shown in FIG. 2A, fuse pad 102 is coupled to a first end of fuse 106, and switching element 108 is coupled to the second end of fuse 106, along with a sensing circuit. The method may include closing the switching element (e.g., switching element 108 of FIG. 2A). In some embodiments, the method includes applying a voltage at the fuse pad so that a programming current flows through the fuse. For example, as shown in FIG. 2A, a voltage is applied to fuse pad 102, resulting in a current flowing through fuse 106. The method may include opening the switching element (e.g., opening MOSFET 108 in FIG. 2A) and coupling the fuse pad to a ground potential (e.g., as shown in FIG. 2B).

In some embodiments, closing the switching element comprises applying a fuse program control signal to the switching element (e.g., applying a voltage on line 110 of switching element 108). In some embodiments, opening the switching element comprises ceasing to apply a fuse program control signal to the switching element (e.g., discontinuing application of a voltage on line 110 of switching element 108).

In some embodiments, the method includes applying a sense current to the second end of the fuse from the fuse state sensing circuit. In some embodiments, the method includes sensing a state of the fuse based on a voltage drop detected and measured by the fuse state sensing circuit across the fuse.

Figure 3:
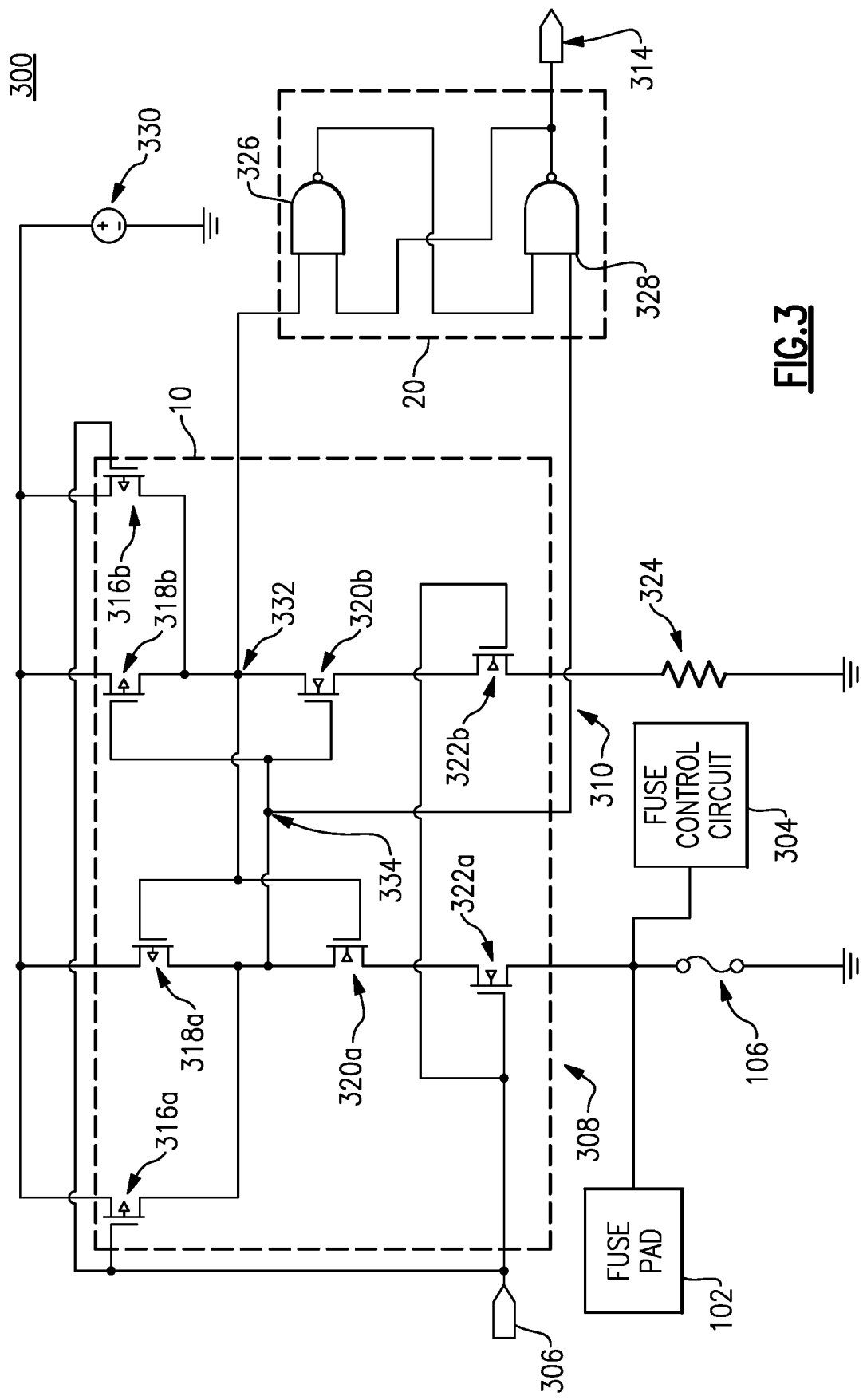
FIG. 3 shows a fuse system that includes a dynamic fuse sensing and latch circuit having one or more features as described herein.

FIG. 3 illustrates an example schematic of a dynamic fuse sensing and latch circuit 300 which may be coupled to a fuse pad 102 and fuse 106 as described herein. One of ordinary skill in the art will understand that alternate implementations of the dynamic fuse sensing and latch circuit 300 are possible.

In the embodiment illustrated in FIG. 3, the fuse sensing circuit 10 includes a first controlled current source 308 and a second controlled current source 310. The first controlled current source 308 may include a P-type Metal Oxide Semiconductor Field Effect Transistor (MOSFET) 316a, a P-type MOSFET 318a, an N-type MOSFET 320a and an N-type MOSFET 322a. The second controlled current source 310 is formed similarly and includes a P-type MOSFET 316b, a P-type MOSFET 318b, an N-type MOSFET 320b, and an N-type MOSFET 322b. The latch circuit 20 may include a first NAND gate 326 and a second NAND gate 328.

The MOSFET 316a includes a source configured to be connected to a voltage source 330, a gate connected to the sense enable input 306, and a drain connected to a drain of the MOSFET 318a, a drain of the MOSFET 320a, a gate of the MOSFET 318b, a gate of the MOSFET 320b, and a first input of the second NAND gate 328. The MOSFET 318a includes a source configured to be connected to the voltage source 330, a gate connected to a gate of the MOSFET 320a, a first input of the first NAND gate 326, a drain of the MOSFET 316b, a drain of the MOSFET 320a, the drain of the MOSFET 316a, the first input of the second NAND gate 328, the gate of the MOSFET 318b, and the gate of the MOSFET 320b.

The drain of the MOSFET 320a is connected to the drain of the MOSFET 316a, the drain of the MOSFET 318a, the first input of the second NAND gate 328, the gate of the MOSFET 318b, and the gate of the MOSFET 320b. The gate of MOSFET 320a is connected to the gate of the MOSFET 318a, the first input of the first NAND gate 326, the drain of the MOSFET 316b, the drain of the MOSFET 318b, and the drain of the MOSFET 320b, and the source of the MOSFET 320a is connected to a drain of the MOSFET 322a. The drain of the MOSFET 322a is connected to the source of the MOSFET 320a, the gate is connected to the sense enable input 306, and the source is connected to a first contact of the fuse 106. A second contact of the fuse 106 is connected to a reference potential node (e.g., a ground node), and the fuse 106 is further coupled to the fuse control circuit 304.

The MOSFET 316b includes a source configured to be connected to the voltage source 330, a gate connected to the sense enable input 306, and a drain connected to the drain of the MOSFET 318b, the drain of the MOSFET 320b, the gates of the MOSFETs 318a and 320a, and the first input of the first NAND gate 326. MOSFET 388b includes a source configured to be connected to the voltage source 330, a gate connected to the gate of the MOSFET 320b, the drains of the MOSFETs 316a and 318a, the drain of the MOSFET 320a, and the first input of the second NAND gate 328, and a drain connected to the drain of the MOSFET 316b, the drain of the MOSFET 320b, the gates of the MOSFETs 318a and 320a, and the first input of the first NAND gate 326.

The MOSFET 320b includes a drain connected to the drain of the MOSFET 316b, the drain of the MOSFET 318b, the gates of the MOSFETs 318a and 320a, and the first input of the first NAND gate 326, a gate connected to the gate of the MOSFET 318b, the drains of the MOSFETs 316a and 318a, the drain of the MOSFET 320a, and the first input of the second NAND gate 328, and a source connected to a drain of the MOSFET 322b. The MOSFET 322b includes a drain connected to the source of the MOSFET 320b, a gate connected to the sense enable input 306, and a source connected to a first contact of the resistor 324. A second contact of the resistor 324 is connected to a reference potential node (e.g., a ground node).

In some embodiments, fuse control circuit 304 is configured to program a state (e.g., blown or intact) of fuse 106 by altering the resistance of fuse 106. For example, an intact fuse may have a resistance of approximately 200 Ohms, while a blown fuse may have a resistance of approximately 2000 Ohms (i.e., a magnitude higher). In accordance with aspects of the present disclosure, in a blown state, fuse 106 remains physically intact, but the structure of fuse 106 is changed sufficiently to alter a resistance value of the fuse 106. In some embodiments, fuse control circuit 304 is implemented in fuse pad 102, while in some embodiments, fuse control circuit 304 is a distinct circuit from fuse pad 102. FIG. 3 illustrates a sensing circuit 10 implemented at a first end of fuse 106, as shown in FIG. 1A. However, one of ordinary skill in the art will understand that sensing circuit 10 may be implemented at a second end of fuse 106 as shown in FIG. 2A. Additionally, FIG. 3 does not illustrate implementation of switching element 108, between a second end of fuse 106 and ground, however one of ordinary skill in the art will understand that this could be implemented as shown in FIGS. 1A-2B.

FIG. 3 shows an example embodiment of a fuse sensing circuit 10 coupled to a fuse 106. For the purpose of description, it will be understood that such a fuse may be implemented on a semiconductor die and configured to be in a first state (e.g., intact state) or a second state (e.g., blown state). In some embodiments, some or all of a fuse system 300 having one or more features as described herein can be implemented on a semiconductor die. Such a semiconductor die can also include an integrated circuit that utilizes the fuse system 300. In some embodiments, a fuse 106 associated with the fuse system 300 can be formed as part of the die, and substantially all of a fuse sensing circuit 10 of the fuse system 300 can also be implemented on the die.

In some embodiments, a radio-frequency (RF) system can include a fuse system 200 having one or more features as described herein. Such a fuse system 200 can be utilized for initializing and/or resetting one or more integrated circuits, including one or more RF circuits. Such an RF system can be configured to receive a signal such as a Vio signal by a control system such as a MIPI (Mobile Industry Processor Interface) controller and a POR circuit. The POR circuit can generate a POR signal and related signal(s) such as a $\overline{POR}$ signal, and provide such signals to the MIPI controller as well as the fuse system 200. Based on such signals, the fuse system 200 can determine the states of various fuses associated with the one or more RF circuits, and provide such fuse states to the MIPI controller. Based on such fuse states, the MIPI controller can generate control signals to initialize and/or reset the one or more RF circuits.

In some embodiments, a fuse system 200 having one or more features as described herein can be implemented in an electronic module. Such a module can include a packaging substrate configured to receive a plurality of components, including one or more semiconductor die having integrated circuits. As described herein, such semiconductor die can include a number of fuses with different states. Thus, the fuse system 200 can program and sense such fuse states as described herein, and provide such information to a control system. The control system can generate control signals based on such fuse states, and such control signals can be utilized to initialize and/or reset one or more integrated circuits in the one or more semiconductor die.

In some embodiments, a fuse system 200 having one or more features as described herein can be implemented in an RF module. Such a module can include a packaging substrate configured to receive a plurality of components, including one or more semiconductor die having RF circuits. As described herein, such semiconductor die can include a number of fuses with different states. Thus, the fuse system 200 can program and sense such fuse states as described herein, and provide such information to a controller such as a MIPI controller. The controller can generate control signals based on such fuse states, and such control signals can be utilized to initialize and/or reset one or more RF circuits in the one or more semiconductor die.

In some embodiments, an RF module can be implemented as a front-end module (FEM). Such a module can include a one or more semiconductor die having RF circuits associated with a front-end (FE) architecture. As described herein, such semiconductor die can include a number of fuses with different states. Thus, the fuse system 200 can program and sense such fuse states as described herein, and provide such information to a controller such as a MIPI controller. Such a controller can generate control signals based on such fuse states, and such control signals can be utilized to initialize and/or reset one or more RF circuits associated with the front-end architecture.

In some embodiments, an RF module can be implemented as a power amplifier module (PAM). Such a module can include one or more semiconductor die having RF circuits associated with power amplifier(s) and related circuits. As described herein, such semiconductor die can include a number of fuses with different states. Thus, the fuse system 200 can program and sense such fuse states as described herein, and provide such information to a controller such as a MIPI controller. Such a controller can generate control signals based on such fuse states, and such control signals can be utilized to initialize and/or reset one or more RF circuits associated with the power amplifier(s) and related circuits.

In some embodiments, an RF module can be implemented as a switch module (e.g., an antenna switch module (ASM)). Such a module can include one or more semiconductor die having RF circuits associated with switches and related circuits. As described herein, such semiconductor die can include a number of fuses with different states. Thus, the fuse system 200 can program and sense such fuse states as described herein, and provide such information to a controller such as a MIPI controller. Such a controller can generate control signals based on such fuse states, and such control signals can be utilized to initialize and/or reset one or more RF circuits associated with the switches and related circuits.

In some embodiments, an RF module can be implemented as a diversity receive (DRx) module. Such a module can include one or more semiconductor die having RF circuits associated with low-noise amplifiers (LNAs), switches, etc., and related circuits. As described herein, such semiconductor die can include a number of fuses with different states. Thus, the fuse system 200 can sense such fuse states as described herein, and provide such information to a controller such as a MIPI controller. The controller can generate control signals based on such fuse states, and such control signals can be utilized to initialize and/or reset one or more RF circuits associated with the LNAs, switches, etc., and related circuits.

In some implementations, an architecture, device and/or circuit having one or more features described herein can be included in an RF device such as a wireless device. Such an architecture, device and/or circuit can be implemented directly in the wireless device, in one or more modular forms as described herein, or in some combination thereof. In some embodiments, such a wireless device can include, for example, a cellular phone, a smart-phone, a hand-held wireless device with or without phone functionality, a wireless tablet, a wireless router, a wireless access point, a wireless base station, etc. Although described in the context of wireless devices, it will be understood that one or more features of the present disclosure can also be implemented in other RF systems such as base stations.

Figure 4:
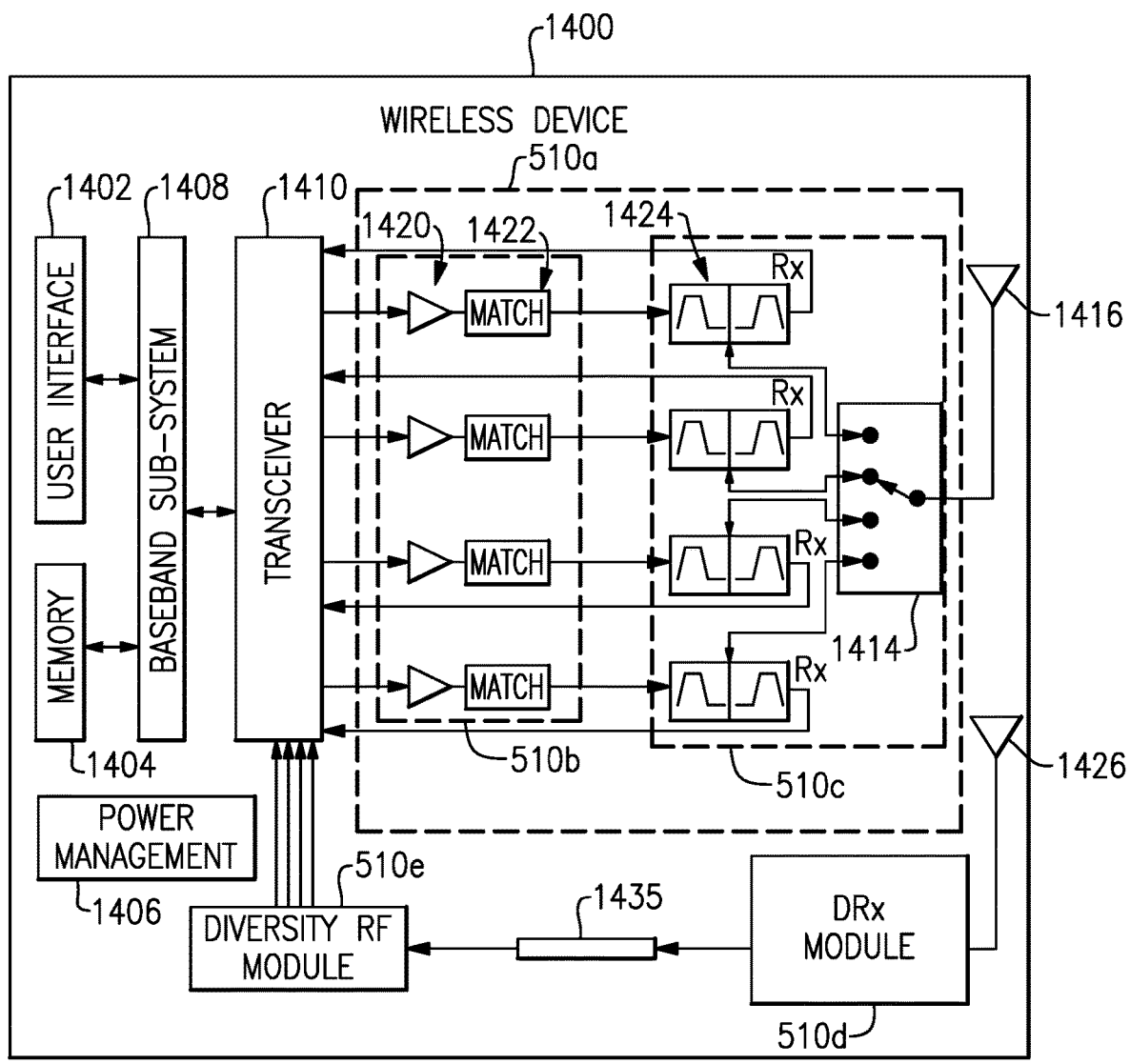
FIG. 4 depicts an example wireless device having one or more advantageous features described herein.

FIG. 4 depicts an example wireless device 1400 having one or more advantageous features described herein. In some embodiments, a fuse system having one or more features as described herein can be implemented in a number of places in such a wireless device. For example, in some embodiments, such advantageous features can be implemented in a module such as a front-end module 510*a*, a power amplifier module 510*b*, a switch module 510*c*, a diversity receive module 510*d*, and/or a diversity RF module 510*e*.

In the example of FIG. 4, power amplifiers (PAs) 1420 can receive their respective RF signals from a transceiver 1410 that can be configured and operated to generate RF signals to be amplified and transmitted, and to process received signals. The transceiver 1410 is shown to interact with a baseband sub-system 1408 that is configured to provide conversion between data and/or voice signals suitable for a user and RF signals suitable for the transceiver 1410. The transceiver 1410 is also shown to be connected to a power management component 1406 that is configured to manage power for the operation of the wireless device 1400. Such power management can also control operations of the baseband sub-system 1408 and other components of the wireless device 1400.

The baseband sub-system 1408 is shown to be connected to a user interface 1402 to facilitate various input and output of voice and/or data provided to and received from the user. The baseband sub-system 1408 can also be connected to a memory 1404 that is configured to store data and/or instructions to facilitate the operation of the wireless device, and/or to provide storage of information for the user.

In the example of FIG. 4, the diversity receive module 510*d* can be implemented relatively close to one or more diversity antennas (e.g., diversity antenna 1426). Such a configuration can allow an RF signal received through the diversity antenna 1426 to be processed (in some embodiments, including amplification by an LNA) with little or no loss of and/or little or no addition of noise to the RF signal from the diversity antenna 1426. Such processed signal from the diversity receive module 510*d* can then be routed to the diversity RF module 510*e* through one or more signal paths (e.g., through a lossy line 1435).

In the example of FIG. 4, a main antenna 1416 can be configured to, for example, facilitate transmission of RF signals from the PAs 1420. Such amplified RF signals from the PAs 1420 can be routed to the antenna 1416 through respective matching networks 1422, duplexers 1424, and am antenna switch 1414. In some embodiments, receive operations can also be achieved through the main antenna. Signals associated with such receive operations can be routed to a receiver circuit through the antenna switch 1414 and the respective duplexers 1424.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio-frequency module comprising:
   a semiconductor die including an integrated circuit; and
   a fuse circuit including a fuse pad configured to receive a voltage, a fuse having a first end coupled to the fuse pad and a second end coupled to a switching element configured to enable a current to pass from the fuse pad to a ground potential, and a fuse state sensing circuit coupled to the second end of the fuse and configured to apply a sense current to the second end of the fuse such that the sense current flows through the fuse to the fuse pad.

2. The radio-frequency module of claim 1 wherein the fuse state sensing circuit is configured to be coupled to a plurality of fuse circuits.

3. The radio-frequency module of claim 1 wherein the fuse state sensing circuit is dedicated to only be coupled to the fuse circuit.

4. The radio-frequency module of claim 1 wherein the switching element is a voltage-controlled switching element.

5. The radio-frequency module of claim 4 wherein the voltage-controlled switching element is coupled to a fuse program control signal.

6. The radio-frequency module of claim 1 wherein the switching element is configured to be closed during a programming operational mode of the fuse.

7. The radio-frequency module of claim 6 wherein the fuse pad receives a programming voltage during the programming operational mode of the fuse.

8. The radio-frequency module of claim 1 wherein the switching element is configured to be open during a sensing operational mode of the fuse.

9. The radio-frequency module of claim 8 wherein the fuse pad is coupled to another ground potential during the sensing operational mode of the fuse.

10. The radio-frequency module of claim 9 wherein the other ground potential is the same as the ground potential.

11. The radio-frequency module of claim 9 wherein the ground potential is different from the other ground potential.

12. The radio-frequency module of claim 1 wherein the fuse circuit is implemented on the semiconductor die.

13. The radio-frequency module of claim 1 wherein the switching element is a metal oxide field effect transistor.

14. The radio-frequency module of claim 1 wherein the radio-frequency module is one or more of: a front-end module, a power amplifier module, an antenna switch module, or a diversity receive module.

15. An electronic module comprising:
    a packaging substrate configured to receive a plurality of components, including a semiconductor die including an integrated circuit; and
    a fuse circuit including a fuse pad configured to receive a voltage, a fuse having a first end coupled to the fuse pad and a second end coupled to a switching element configured to enable a current to pass from the fuse pad to a ground potential, and a fuse state sensing circuit coupled to the second end of the fuse and configured to apply a sense current to the second end of the fuse such that the sense current flows through the fuse to the fuse pad.

16. The electronic module of claim 15 wherein the switching element is a voltage-controlled switching element.

17. The electronic module of claim 16 wherein the voltage-controlled switching element is coupled to a fuse program control signal.

18. The electronic module of claim 15 wherein the switching element is configured to be closed during a programming operational mode of the fuse.

19. The electronic module of claim 18 wherein the fuse pad receives a programming voltage during the programming operational mode of the fuse.

20. The electronic module of claim 15 wherein the switching element is configured to be open during a sensing operational mode of the fuse.

* * * * *